United States Patent
Lai et al.

(10) Patent No.: US 8,105,648 B2
(45) Date of Patent: Jan. 31, 2012

(54) METHOD FOR OPERATING A CHEMICAL DEPOSITION CHAMBER

(75) Inventors: Chien-Hsin Lai, Tainan (TW); Tzu-Chin Tseng, Tainan County (TW); Ying-Yi Chang, Chia-Yi Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 621 days.

(21) Appl. No.: 12/119,493

(22) Filed: May 13, 2008

(65) Prior Publication Data

US 2009/0286009 A1    Nov. 19, 2009

(51) Int. Cl.
    *C23C 16/455*    (2006.01)
(52) U.S. Cl. ........... 427/248.1; 427/255.29; 427/534; 427/535; 427/569
(58) Field of Classification Search ........... 427/248.1, 427/534, 535, 255.29, 569
    See application file for complete search history.

(56) References Cited

U.S. PATENT DOCUMENTS

| | | | | |
|---|---|---|---|---|
| 5,734,586 A * | 3/1998 | Chiang et al. | ............ | 700/286 |
| 5,776,254 A * | 7/1998 | Yuuki et al. | ............ | 118/725 |
| 6,221,164 B1 * | 4/2001 | Gologhlan et al. | ............ | 118/719 |
| 6,389,364 B1 * | 5/2002 | Vyers | ............ | 702/45 |
| 6,663,716 B2 | 12/2003 | Loan | | |
| 6,767,402 B2 | 7/2004 | Takamatsu | | |
| 7,192,626 B2 | 3/2007 | Dussarrat | | |
| 7,380,564 B2 * | 6/2008 | Lull et al. | ............ | 137/1 |
| 2005/0221020 A1 * | 10/2005 | Fukiage | ............ | 427/569 |
| 2007/0194470 A1 * | 8/2007 | Dedontney | ............ | 261/76 |

FOREIGN PATENT DOCUMENTS

| | | |
|---|---|---|
| CN | 1300328 A | 6/2001 |
| CN | 1685486 A | 10/2005 |
| JP | P2003158122 A | 5/2003 |

OTHER PUBLICATIONS

Sturm, J.C., et al., "Growth of Si1-xGex by rapid thermal chemical vapor deposition and application to heterojunction bipolar transistors". J. Vac. Sci. Technol. B 9 (4), Jul./Aug. 1991 p. 2011-2016.*
Boyd, Kevin, et al., "A New Device for Highly Accurate Gas Flow Control With Extremely Fast Response Times". Citation, date, and pages are unavailable.*

* cited by examiner

*Primary Examiner* — Bret Chen
(74) *Attorney, Agent, or Firm* — Winston Hsu; Scott Margo

(57) ABSTRACT

A method for operating a chemical deposition chamber is disclosed. First, a digital liquid flow controller is provided to guide a precursor fluid into a chemical deposition chamber. Then, a pre-cleaning step is performed in the chemical deposition chamber. Later, a pre-tuning step is performed on the digital liquid flow controller so that the precursor fluid can be substantially stably guided into the chemical deposition chamber. Afterwards, the chemical deposition chamber is used to carry out the chemical deposition.

13 Claims, 1 Drawing Sheet

METHOD FOR OPERATING A CHEMICAL DEPOSITION CHAMBER

BACKGROUND OF THE INVENTION

1. Field of the Invention

The present invention relates to a method for operating a chemical deposition chamber. In particular, the present invention relates to a method for operating a chemical deposition chamber so that a precursor fluid can be substantially stably guided into the chemical deposition chamber.

2. Description of the Prior Art

The method of chemical vapor deposition plays an important role in the manufacturing of the semiconductors. The chemical vapor deposition enables the construction and development of a solid film from various specific materials on a wafer, such as poly-Si layers, interlayer dielectrics, interlayer metal dielectrics, shallow trench isolations and passivations in a range from as low as 0.5 μm to several μm. The desirous elements or material layers are therefore formed on the wafers with the help of appropriate lithographic or etching procedures.

The general chemical vapor deposition system usually includes several parts, such as a deposition chamber, a wafer transfer device, a wafer supporting device and a precursor inlet. A substrate, such as a wafer, enters the deposition chamber and stays on the wafer supporting device through the wafer transfer device. The precursor fluid later enters the deposition chamber through the precursor inlet. Then the materials coming from the gas containing the atoms to be deposited are uniformly deposited on the substrate through chemical reactions.

There are many factors which are able to affect the quality of the chemical deposition, for example, the pressure of the deposition chamber, the temperature of the substrate, the flow rate of the gas, the path of the gas passing over the wafers, the chemical composition of the gas, the flow ratio among different gases, the reactions of the intermediates in the chemical reactions, whether the desirous reactions depending on exterior energy to accelerate or to induce themselves, the energy source outside of the deposition chamber such as the energy of the plasma, ion energy or the RF bias on the substrate. Further, the variables in the deposited films, such as the uniformity, step coverage on the patterns, chemical formulae (chemical compositions and distribution), crystallization orientation and defect density should be considered. Moreover, the deposition rate of the film is another factor, because it affects the throughput of the deposition chamber and a high deposition rate often compromise with the quality of the films.

In addition, the materials from the precursors by chemical reactions not only uniformly deposit on the substrate but also accumulate on the inner walls of the chemical deposition chamber to cause contamination along with by-products. Such materials and by-products accumulated on the inner walls of the chemical deposition chamber on one hand cause the source of contaminations such as particles or peelings, but also affect the thermal conductivity of the chemical deposition chamber. It is crucial how many times and how thorough the in-situ plasma cleaning are conducted on the chemical deposition chamber. In order to solve the problems, conventionally a pre-cleaning step is carried out on the chemical deposition chamber after a determined RF power hour, a determined number of processed chips and a determined time period to remove excess material layers.

For example, U.S. application 2005/0221020 provides a plasma enhanced chemical vapor deposition (PECVD) system. The method includes performing a chamber-seasoning step, which includes at least one of a deposition chamber cleaning step and a deposition chamber pre-coating step. After the deposition step, a post-process chamber cleaning process may be performed.

After the chamber-cleaning step, the precursor fluid will surely re-enter the chemical deposition chamber through the precursor inlet when the system is back on the deposition step on the wafers. However, the inventor observed that such precursor fluid re-entering the chemical deposition chamber would be under the situation of unstable flow rate, in particular at first re-entering the chemical deposition chamber. If a thinner film is about to be deposited on the substrate, the thickness of the film would be greatly fluctuating and the quality of the products would be therefore compromised.

One of the current solutions is that dummy wafers are used to test the deposition of the thickness of the films after the chamber-cleaning step to estimate the stability of the flow rate of the precursor fluid, or multiple dummy wafers are directly used to undergo the chemical deposition to drain the unstable flow of the precursor fluid during the dummy chemical deposition procedures. However, it is very complicated and time-consuming to transfer the dummy wafers into and out of the chemical deposition chamber through the wafer transfer device, to vacuum, to deposit the material layers and to measure the thickness of the material layers, which greatly influences the efficiency of the chemical deposition step.

Thus, there is a need for a novel method for operating a chemical deposition chamber to stabilize the flow rate of the precursor as soon as possible after the chamber-cleaning step to boost the efficiency of the chemical deposition step.

SUMMARY OF THE INVENTION

The present invention therefore provides a novel method for operating a chemical deposition chamber, which is characterized in that the flow rate of the precursor is able to be stabilized by a simple way as soon as possible after the chamber-cleaning step to boost the efficiency of the chemical deposition step.

In the method for operating a chemical deposition chamber of the present invention first a chemical deposition chamber, a precursor inlet, and a digital liquid flow controller are provided. The precursor inlet is connected to the chemical deposition chamber, and the digital liquid flow controller is connected to the precursor inlet to control a precursor fluid into the chemical deposition chamber through the precursor inlet. Second, a pre-cleaning step is performed on the chemical deposition chamber. Then, a pre-tuning step is performed on the digital liquid flow controller so that the precursor fluid can be substantially stably guided into the chemical deposition chamber. The pre-tuning step includes a cycle of turning on the digital liquid flow controller for a pre-determined period of time then turning off the digital liquid flow controller to be repeated at least one time. Later, a chemical vapor deposition step is performed on at least one substrate using the chemical deposition chamber.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
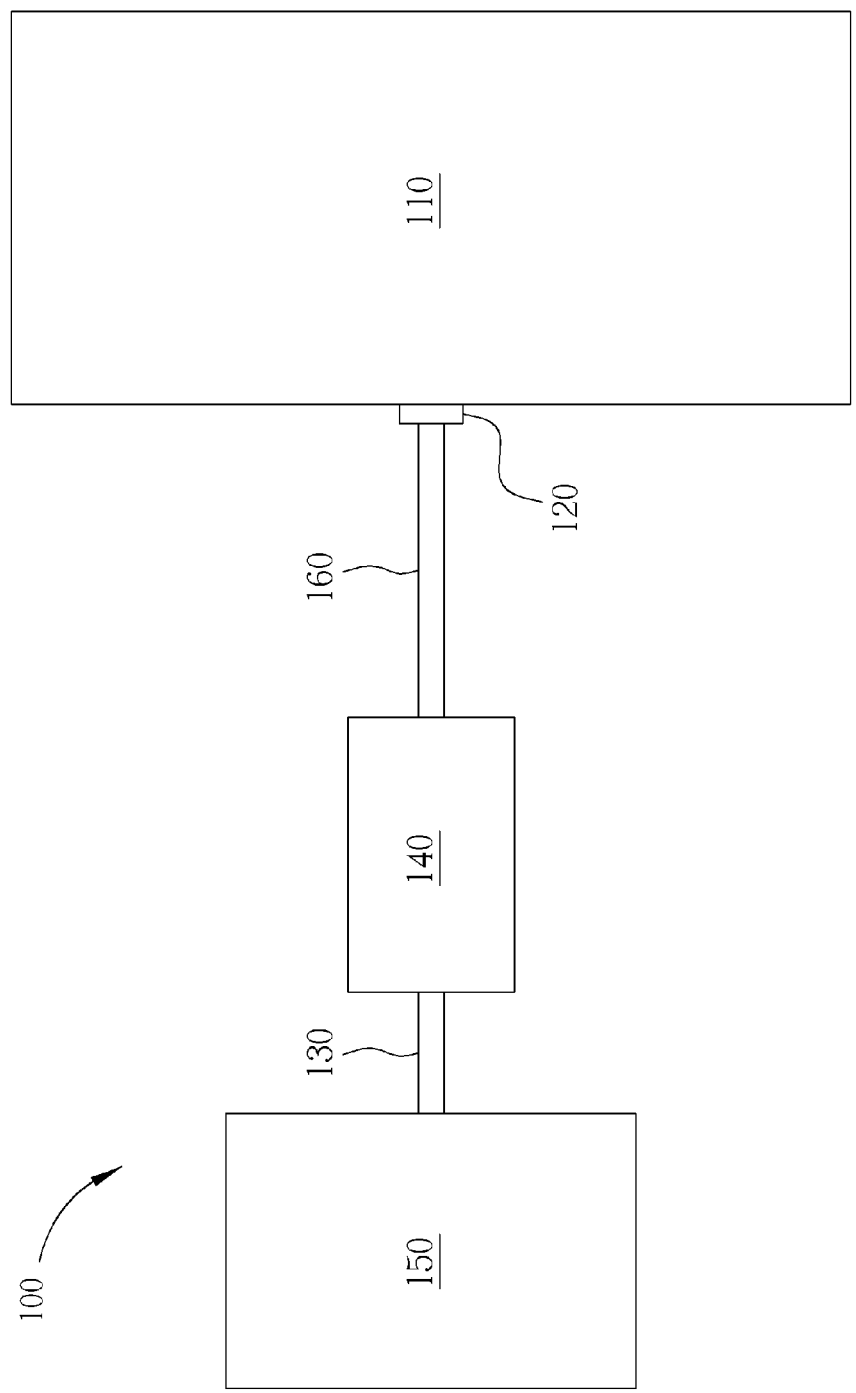
FIG. 1 illustrates a preferred embodiment of the method for operating a chemical deposition chamber of the present invention.

The present invention provides a novel method for operating a chemical deposition chamber. The method of the present invention is characterized in that a pre-tuning step is performed on the digital liquid flow controller after the chamber-cleaning step so that the flow rate of the precursor fluid is able to be stabilized by a simple way as soon as possible. After that, the material layers obtained from the deposition procedure in the chemical deposition chamber may have uniform thickness because of the stabilized flow rate of the precursor fluid. The method of the present invention is simple and fast, and may greatly boost the efficiency of the chemical deposition step.

FIG. 1 illustrates a preferred embodiment of the method for operating a chemical deposition chamber of the present invention. First, a chemical vapor deposition system 100 is provided. The chemical vapor deposition system 100 includes a chemical deposition chamber 110, a precursor inlet 120, a precursor fluid 130, a digital liquid flow controller 140 and a precursor fluid supplier 150. The precursor fluid supplier 150, the digital liquid flow controller 140, the precursor inlet 120 and the chemical deposition chamber 110 are directly or indirectly connected to each other through the pipeline 160.

The precursor fluid 130 coming from the precursor fluid supplier 150 enters the chemical deposition chamber 110 through the precursor inlet 120 and the pipeline 160. The digital liquid flow controller 140 that is connected to the precursor inlet 120 controls the quantity of precursor fluid 130 entering the chemical deposition chamber 110. The chemical deposition chamber 110 is employed for performing a chemical vapor deposition step, such as a plasma-enhanced chemical vapor deposition step.

The precursor fluid 130 used in the chemical deposition chamber 110 usually includes an organic precursor fluid, for example a low-K precursor fluid such as a tetraethoxy silane (TEOS) precursor fluid. Generally speaking, the precursor fluid 130 is a liquid before passing through the digital liquid flow controller 140 and the precursor fluid 130 becomes a gas through a valve (not shown) after passing through the digital liquid flow controller 140.

Generally speaking, after the batch production, the regular maintenance, or the failure check, the chemical deposition chamber 110 should undergo a chemical deposition step to deposit a required film on a substrate. Nevertheless, before the chemical deposition step carried out in the chemical deposition chamber 110, the chemical deposition chamber 110 should undergo a pre-cleaning step to clean up the chemical deposition chamber 110. Such pre-cleaning step may be performed by an ex-situ pre-cleaning step or an in-situ pre-cleaning step. The in-situ pre-cleaning step may usually use a cleaning agent in the presence of energy which can be generated in the chemical deposition chamber or transported to the chemical deposition chamber form a remote source. The ex-situ pre-cleaning step may open the chemical deposition chamber manually to clean the chemical deposition chamber.

The cleaning agent is usually a reactive gas, for example a fluoro-containing gas such as $NF_3$, $CF_4$, $C_2F_6$, $C_3F_8$, $C_4F_8$, $SF_6$, $CHF_3$, $F_2$, $COF_2$ or the combination thereof, an oxygen-containing gas such as $O_2$, $O_3$, $CO$, $NO$, $N_2O$, $CO_2$ or the combination thereof, or a inert gas such as $He$, $N_2$, $Ar$ or the combination thereof. The energy may come from a single or multiple energy sources, such as heat, RF power, plasma . . . etc.

The pre-cleaning step is usually performed in the absence of the precursor fluid 130. If the pre-cleaning step is performed in the presence of the reactive gas in combination of plasma, the chemical deposition chamber 110 should be in the vacuum state.

Afterwards, before the initiation of the chemical vapor deposition step using the chemical deposition chamber 110, a pre-tuning step is performed on the digital liquid flow controller 140 so that the precursor fluid 130 can be substantially stably guided into the chemical deposition chamber 110 since it needs to reboot the digital liquid flow controller 140.

Please note that, in order to render the precursor fluid substantially stably guided into the chemical deposition chamber to ensure the material layer formed in the chemical deposition chamber has uniform thickness because the precursor fluid that re-enters the chemical deposition chamber may have unstable flow rate, the method of the present invention includes a pre-tuning step. Such pre-tuning step may preferably be turning on the digital liquid flow controller for a pre-determined time period and turning off the digital liquid flow controller to complete a cycle at least one time.

The time period for turning on the digital liquid flow controller is optional. In one embodiment of the present invention, the time period for turning on the digital liquid flow controller may be 1-10 seconds, preferably 5-6 seconds for the time period which controls turning on the digital liquid flow controller. Or the digital liquid flow controller may be turned on several times, such as 1, 7, or 10 times with no time limit. The time period to complete a cycle of turning on and off the chamber depends on the respond speed of the device. This way, the unsteady state with respect to the preliminary stage of the precursor fluid passing through the digital liquid flow controller can be eliminated to ensure the material layers formed in the chemical deposition chamber have uniform thickness.

On the other side, before the pre-tuning step a pre-depositing step may be optionally performed in the chemical deposition chamber 110. In this pre-depositing step a substrate may be present or absent in the chemical deposition chamber. The substrate may be a dummy plate.

After the pre-tuning step, the precursor fluid stably passes through the digital liquid flow controller. Then, the primary task of the chemical deposition chamber, placing the substrate in the chamber 110, can be carried out, i.e., a chemical vapor deposition step is performed on at least one substrate using the chemical deposition chamber till a next pre-cleaning step.

In other words, after a certain number of substrates undergo the chemical vapor deposition step in the chemical deposition chamber, the afore-mentioned pre-cleaning step may be performed again to clean the chemical deposition chamber. The ways to clean the chemical deposition chamber may be as described above. After the pre-cleaning step, the afore-mentioned steps such as the pre-depositing step, the pre-tuning step and the chemical vapor deposition step may be optionally or repeatedly performed.

The novel method for operating a chemical deposition chamber of the present invention provides a pre-tuning step on the digital liquid flow controller following the chamber-cleaning step prior to the chemical deposition step. Such pre-tuning step allows the precursor fluid to enter the chemical deposition chamber stably so as to eliminate the situation of unstable flow rate of the precursor fluid in the digital liquid flow controller. After that, the material layer obtained from the deposition procedure in the chemical deposition chamber may have uniform thickness. The method of the present invention is simple and fast, and may greatly boost the efficiency of the chemical deposition step.

Those skilled in the art will readily observe that numerous modifications and alterations of the device and method may be made while retaining the teachings of the invention.

What is claimed is:

1. A method for operating a chemical deposition chamber, comprising:
   providing a chemical deposition chamber, a precursor inlet connected to said chemical deposition chamber, and a digital liquid flow controller connected to said precursor inlet to control a precursor fluid into said chemical deposition chamber through said precursor inlet;
   performing a pre-cleaning step on said chemical deposition chamber;
   performing a pre-tuning step on said digital liquid flow controller, wherein said pre-tuning step comprises turning on said digital liquid flow controller and turning off said digital liquid flow controller at least one time;
   placing a substrate in said chemical deposition chamber after performing said pre-cleaning step and said pre-tuning step; and
   performing a chemical vapor deposition step on said substrate using said chemical deposition chamber.

2. The method of claim 1, wherein said precursor fluid comprises a low-K precursor fluid.

3. The method of claim 1, wherein said precursor fluid comprises a TEOS precursor fluid.

4. The method of claim 1, wherein said pre-cleaning step comprises an in-situ pre-cleaning step.

5. The method of claim 1, wherein said pre-cleaning step comprises an ex-situ pre-cleaning step.

6. The method of claim 1, wherein said pre-cleaning step uses plasma.

7. The method of claim 1, wherein said pre-cleaning step uses a reactive gas.

8. The method of claim 1, wherein said pre-cleaning step comprises vacuum extraction.

9. The method of claim 1, before said pre-tuning step further comprising:
   performing a pre-deposition step on said chemical deposition chamber.

10. The method of claim 1, wherein said pre-tuning step comprises turning on said digital liquid flow controller for 1-10 second(s) and turning off said digital liquid flow controller and performing a cycle of turning on and off said digital liquid flow controller at least one time.

11. The method of claim 1, wherein said pre-tuning step comprises turning on said digital liquid flow controller for 5-6 seconds and turning off said digital liquid flow controller and performing a cycle of turning on and off said digital liquid flow controller at least one time.

12. The method of claim 1, wherein said pre-tuning step comprises performing a cycle of turning on and off said digital liquid flow controller continuously 7 times.

13. The method of claim 1, wherein said chemical vapor deposition step is a plasma-enhanced chemical vapor deposition step.

* * * * *